(12) United States Patent
Tomishima

(10) Patent No.: US 7,697,357 B2
(45) Date of Patent: Apr. 13, 2010

(54) NEGATIVE VOLTAGE DRIVING FOR THE DIGIT LINE ISOLATION GATES

(75) Inventor: Shigeki Tomishima, Boise, ID (US)

(73) Assignee: Micron Technology, Inc., Boise, ID (US)

(*) Notice: Subject to any disclaimer, the term of this patent is extended or adjusted under 35 U.S.C. 154(b) by 143 days.

(21) Appl. No.: 11/084,345

(22) Filed: Mar. 17, 2005

(65) Prior Publication Data

US 2006/0209604 A1 Sep. 21, 2006

(30) Foreign Application Priority Data

Feb. 15, 2005 (JP) ............................. 2005-037029

(51) Int. Cl.
*G11C 7/00* (2006.01)
(52) U.S. Cl. .................... 365/203; 365/189.11
(58) Field of Classification Search ................. 365/203, 365/189.11
See application file for complete search history.

(56) References Cited

U.S. PATENT DOCUMENTS

| | | | |
|---|---|---|---|
| 5,245,569 A | | 9/1993 | Gonzalez et al. |
| 5,367,213 A | | 11/1994 | Casper |
| 5,901,078 A | | 5/1999 | Porter et al. |
| 5,903,511 A | * | 5/1999 | Gillingham ............ 365/230.06 |
| 5,999,471 A | * | 12/1999 | Choi ............................ 365/222 |
| 6,021,072 A | * | 2/2000 | Takeda et al. ........... 365/189.11 |
| 6,310,795 B1 | * | 10/2001 | Morishima ..................... 365/63 |
| 6,445,610 B1 | | 9/2002 | Porter et al. |
| 6,590,819 B1 | | 7/2003 | Baum et al. |
| 6,754,131 B2 | * | 6/2004 | Kirsch et al. ............ 365/230.06 |
| 6,809,986 B2 | | 10/2004 | Kim et al. |
| 6,815,282 B2 | * | 11/2004 | Dachtera et al. ............. 438/204 |
| 6,850,454 B2 | * | 2/2005 | Kuge et al. .................. 365/227 |
| 7,020,005 B2 | * | 3/2006 | Karlsson et al. ............. 365/145 |
| 7,142,446 B2 | * | 11/2006 | Derner et al. ................ 365/149 |
| 7,209,384 B1 | * | 4/2007 | Kim ............................. 365/175 |
| 2002/0027800 A1 | | 3/2002 | Porter et al. |

(Continued)

OTHER PUBLICATIONS

Jae-Yoon Sim, et al, Charge-Transferred Presensing and Efficiently Precharged Negative Word-Line Schemes for Low-Voltage DRAMs, Symposium on VLSI Circuits Digest of Technical Papers, 2003, pp. 289-292.

*Primary Examiner*—Michael T Tran
(74) *Attorney, Agent, or Firm*—Jones Day; Edward L. Pencoske

(57) ABSTRACT

A system and method to reduce standby leakage current in the event of row-to-column shorts in a memory chip or in an electronic device having memory or data storage elements is disclosed. In case of memory rows or wordlines precharged to a negative wordline voltage (VNWL), the standby leakage current through Psense-amplifiers in the memory is substantially eliminated when the gates of isolation (ISO) transistors associated with the shorted wordline and digitline(s) are held at the VNWL level by an isolation signal driven to the VNWL level during the memory row standby state. The reduction in the standby leakage current further reduces the overall Icc current consumption from the memory circuit's supply or operating voltage Vcc, thereby reducing circuit's standby power consumption. Because the ISO gates are already fabricated with thick oxides, the present negative voltage driving methodology does not require modifying the sense amplifier layout or the configuration of existing isolation transistors in a memory chip. A different standby voltage level (Vcc/2 level) at the sense amplifier activation (ACT) signal may also be implemented. Because of the rules governing abstracts, this abstract should not be used to construe the claims.

37 Claims, 5 Drawing Sheets

U.S. PATENT DOCUMENTS

2004/0085844 A1* 5/2004 Arimoto et al. ............. 365/210
2004/0145959 A1* 7/2004 Kuge et al. ............ 365/230.03
2004/0218442 A1* 11/2004 Kirsch et al. ................ 365/202
2005/0063220 A1* 3/2005 Johnson ...................... 365/154
2005/0068838 A1* 3/2005 Kono et al. ............ 365/230.01
2007/0081380 A1* 4/2007 Atwood et al. .............. 365/150

* cited by examiner

NEGATIVE VOLTAGE DRIVING FOR THE DIGIT LINE ISOLATION GATES

BACKGROUND

1. Field of the Disclosure

The present disclosure generally relates to electronic devices and, more particularly, to a system and method to substantially eliminate standby leakage current due to row-column shorts in semiconductor memory chips.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or ball contacts 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, a chip select (CS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in an array of rows and columns. A row decode circuit 28 and a column decode circuit 30 may select the rows and columns, respectively, in the array in response to decoding an address provided on the address bus 17. Data to/from the memory cells 26 are then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. The I/O circuit 32 may also include various memory input buffers and control circuits that interact with the row and column decoders 28, 30, respectively, to select the memory cells for data read/write operations.

The memory controller (not shown) may determine the modes of operation of memory chip 12. Some examples of the input signals or control signals (not shown in FIG. 1) on the control bus 19 include an External Clock (CLK) signal, a Chip Select (CS) signal, a Row Address Strobe (RAS) signal, a Column Address Strobe (CAS) signal, a Write Enable (WE) signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIG. 2 is a simplified architecture for a portion of the memory device 12 shown in FIG. 1. It is evident that complex circuit details and constituent architectural blocks in the memory chip 12 are omitted from FIG. 2 for the sake of clarity and ease of illustration. As shown in FIG. 2, a data storage or memory array may consist of a matrix of storage bits or memory cells 26 divided into a left memory array 34 and a right memory array 36. Each memory bit being exclusively referenced by a corresponding row and column address (that may be present on the address bus 17). Each row of memory cells may be called a "wordline" (WL), whereas each column of memory cells may be called a "digitline" (DL). Each memory bit or memory cell 26 may be connected to only one corresponding digitline and only one corresponding wordline. In FIG. 2, for ease of illustration, each memory array is shown with one wordline—the wordline 38 in the left array 34 and the wordline 40 in the right array 36. Similarly, each memory array is shown with two digitlines—the digitlines 42 and 44 in the left array 34 and the digitlines 46 and 48 in the right array 36. It is noted that the digitlines 44 and 48 are denoted as "DL*" to indicate the paired nature of the digitlines 42 and 44, and 46 and 48, as is known in the art.

In FIG. 2, two equilibration (EQ) circuits 50 and 52 are shown—each one connected to a corresponding pair of digitlines. Thus, the EQ circuit 50 performs equilibration of digitlines 42 and 44 to the DVC2 voltage level (=Vcc/2 V) before a memory cell access or data sensing operation begins as is known in the art. Similarly, the EQ circuit 52 equilibrates the paired digitlines 46 and 48 to the DVC2 voltage level. A sense amplifier circuit consisting of a pair of cross-coupled PMOS (p-channel metal oxide semiconductor) transistors 54 (P1), 56 (P2), and a pair of cross-coupled NMOS (n-channel MOS) transistors 58 (N1), 60 (N2), connected as depicted in FIG. 2, is shown placed between the four digitlines 42, 44, 46, and 48 and operating on them to perform the data sensing operation as is known in the art. The PMOS transistor pair P1-P2 may be called "Psense-amplifiers" and the NMOS transistor pair N1-N2 may be referred to as "Nsense-amplifiers."

The Psense- and Nsense-amplifiers 54, 56, 58, 60 work together to detect the data signal voltage in a memory cell and drive the associated digitlines, accordingly to Vcc and ground. For example, in case of the digitlines 42 and 44, the Nsense-amplifiers 58, 60 may drive the low potential digitline (e.g., the digitline 44) to ground and the Psense-amplifiers 54, 56 may drive the high-potential digitline (e.g., the digitline 42) to Vcc. The operation of the sense amplifier circuit (consisting of transistor pairs P1-P2 and N1-N2) may be controlled by the ACT (activation) signal 61 and the RNL (Row Nsense Latch) signal 62 connected as shown in FIG. 2. For example, the Psense-amplifiers may be activated when the ACT signal is at Vcca level (Vcc voltage for the array) or "high", whereas the Nsense-amplifiers are turned on when the RNL signal goes to logic zero or ground level.

Isolation (ISO) devices are also important during data storage and sensing operations. These devices are generally NMOS transistors placed between the array digitlines and the sense amplifiers. In FIG. 2, the isolation transistors 64-65 are placed and can control the connection between the digitlines 42 and 44 in the left memory array 34 and the P-N sense amplifier circuitry (consisting of transistor pairs P1-P2 and N1-N2 as noted above), whereas the isolation transistors 67-68 are placed to control the connection between the digitlines 46 and 48 in the right memory array 36 and the P-N sense amplifier circuitry (or P1-P2 and N1-N2 transistor pairs). In other words, if digitline nodes X1 and X2 (not shown) were added in the sense amplifier circuitry in FIG. 2 to correspond with the digitline pair DL-DL*, respectively, the isolation transistor 64 is placed between digitline 42 in the left array and the node X1 and the isolation transistor 67 is placed between the node X1 and the digitline 46 in the right array. Similarly, the isolation transistor 65 is placed between the digitline 44 and the node X2 and the isolation transistor 68 is placed between the node X2 and the digitline 48.

The isolation transistors may function to electrically isolate the two memory arrays 34, 36 so that whenever a wordline fires in one of the arrays, the digitline capacitance in that array is reduced because of the isolation of the other array. Further, the isolation transistors may provide resistance between the adjacent P or Nsense amplifier and the associated digitlines. This resistance may stabilize the sense amplifiers and speed up the data sensing operation by isolating the highly capacitive digitlines. In FIG. 2, the activation/deactivation of isolation transistors is shown controlled by the application of the ISOL signal 66 and the ISOR signal 69 to the corresponding gates of the isolation transistors. The ISOL signal 66 controls the isolation transistors 64-65 for the left array 34, whereas the ISOR signal 69 controls the isolation transistors 67-68 for the right array 36.

FIG. 3 illustrates the voltage levels of the ISOL 66 and ISOR 69 signals in FIG. 2 during row activation and row standby states. As is seen from FIG. 3, both the isolation signals—the ISOL signal 66 and ISOR signal 69—are held at Vccp level during a row precharge or standby state. However, in FIG. 3, the ISOL signal 66 is shown to be held at a ground potential (0V) when a row (e.g., WL 40) in the right array 36 is activated or fired for data access. The 0V level at the ISOL signal line 66 results in turning off of the isolation transistors 64-65, thereby allowing for isolation of digitlines X1-X2 (not shown, as discussed before) in the sense amplifier circuitry from those in the left array 34. The ISOR signal 69 is still maintained at the Vccp level during this right-array row activation period. As is known in the art, the Vccp voltage level is more than the memory chip's operating voltage level or the "Vcc" level by Vth (threshold voltage) of a MOS transistor (NMOS or PMOS).

It is known in the art that modern memory circuit designs employ a negative wordline voltage (VNWL) (not shown) to reduce the memory cell leakage current when the corresponding wordline is "off" or "inactive" and to also improve the memory cell refresh characteristics. In FIG. 2, a prior art scheme of maintaining digitlines and wordlines in a memory array in a standby state (e.g., a memory row precharged state) is illustrated via the exemplary voltages illustrated on certain lines. As shown in FIG. 2, during a standby state (i.e., when a row is not fired to commence a data access operation thereon), the ISOL line 66 and the ISOR line 69 are held at Vccp voltage level, the ACT signal line 61 is held at a ground potential (here, at 0V), and the RLNL signal 62 is maintained at the Vcc/2 or DVC2 voltage level. During the standby state, the wordlines (e.g., the wordline 38) are precharged to the VNWL level, which, in case of the embodiment in FIG. 2, is negative 0.3 V (−0.3V). However, the digitlines (e.g., the DL 42 and DL* 44) are precharged to the Vcc/2 (or DVC2) voltage level during the standby state. A wordline may be fired when a Vccp voltage level is applied at the wordline (WL signal).

Because the wordlines and digitlines are precharged to different potentials and because the precharge voltage levels VNWL and DVC2 are internally generated within a memory chip, a row-to-column short may result in a significantly higher standby current when the memory chip 12 is in an inactive or standby state. In FIG. 2, an exemplary short between the WL 38 and the DL 42 is illustrated by a dotted line 70. In the event of such row-to-column short, the precharged lines DL 42 and DL* 44 (precharged to DVC2 level) would be pulled down to the VNWL level (−0.3V) due to leakage current of the row-to-column short 70 through the ISO gates (e.g., the gates of ISO transistors 64-65), which are held at the Vccp level. Because the ACT signal is held at the ground level (0V) during the precharge and standby states, the negative level on the lines DL 42 and DL* 44 will turn on the PMOS transistors 54, 56 in the Psense-amplifiers, thereby establishing a leakage path (DC leakage current) from GND (ACT line 61) to VNWL line (not shown) via the P1 and P2 transistors as illustrated by the arrows 55 in FIG. 2. This DC leakage current increases the Icc current (i.e., the current consumption from the supply voltage Vcc) in the memory standby state, thereby increasing power consumption in and performance degradation of the memory chip 12.

In one prior art method, an attempt is made to stop the DC current through the PMOS transistors P1 (54) and P2 (56) of the Psense amplifiers by driving the ACT signal 61 to the VNWL level (−0.3 V) during the standby state. Thus, the voltage on the ACT signal 61 is maintained at the same level (VNWL level) as the voltage on the wordline 38 during the wordline's precharged state. However, such a use of negative voltage on the ACT line 61 may require use of thick layers of gate oxides for the ACT driver transistors (not shown) and the PMOS sense amplifiers 54, 56. This would cause performance degradation with the same size of devices. Otherwise, to recover the performance, a larger circuit layout area may be required. Further, such negative level on the ACT signal 61 may require changing the connection of the bulk nodes (not shown) of the PMOS transistors 54, 56 from GND level to VNWL level and may also require changing the transistors (not shown) handling the EQ signals in the EQ circuit 50 from thin oxide-based configuration to a thick oxide-based configuration. The thick oxide-based configuration may cause degradation of EQ performance. Further, the negative level on the ACT signal 61 may require changing the "low" level of the EQ signal (not shown) from the GND (0V) level to the VNWL level to ensure that the ACT pull-down driver (not shown) remains off during the row activation state. Because the transistors (not shown) in the EQ circuit 50 have a very large gate capacitance, the power consumption of the VNWL line (not shown) would increase when the EQ signal is held at the VNWL level.

In another prior art method, a bleeder transistor (not shown) controlled by an EQ signal (not shown) is provided so that when a row-to-column short occurs, the bleeder gate is turned off by a signal from a fuse (not shown). Then, the leakage current from the EQ signal to the shorted WL's off level is removed. However, in this method, when the DL line (e.g., the DL line 42) goes down to the VNWL level due to the short on the WL 38 precharged to the negative voltage level VNWL, the shared ISO transistor (e.g., similar to the transistor 64 in FIG. 2) does not completely turn off, which results in additional leakage current in the Psense-amplifiers (e.g., the transistor P1 and P2 in FIG. 2). Thus, this prior art method still has a DC leakage current problem from the sense amplifier nodes (e.g., transistors P1 and P2 in FIG. 2) to the negative WL node (e.g., the WL 38) through the ISO gates (e.g., the gates of ISO transistors 64-65).

It is therefore desirable to devise a system and method to prevent the standby leakage current at the Psense-amplifier transistors due to row-to-column shorts in memory devices without modifying the sense amplifier layout in a memory chip or the layout configuration of isolation transistors in the memory chip.

SUMMARY

The present disclosure contemplates a method of operating a memory device. The method comprises precharging a wordline in the memory device to a predetermined voltage level prior to a data access operation thereon, and maintaining a gate of an isolation transistor at the predetermined voltage prior to the data access operation.

In one embodiment, the present disclosure further contemplates a method of operating a memory device. The method comprises precharging a wordline in the memory device to a predetermined voltage level prior to a data access operation thereon, and maintaining an isolation signal line at the predetermined voltage prior to the data access operation.

In another embodiment, the present disclosure contemplates a method of operating a memory device of the type having a plurality of wordlines and a plurality of digitlines, each of the digitlines having an isolation transistor. The method comprises precharging each of the wordlines to a predetermined voltage level prior to a data access operation, and maintaining the gates of the isolation transistors at or below the predetermined voltage level prior to the data access operation.

In a further embodiment, the present disclosure contemplates a method of operating a memory device,. The method comprises placing a wordline in the memory device at a negative voltage level during a standby state of the wordline prior to a data access operation, and maintaining the negative voltage level on a gate of an isolation transistor in the memory device so long as the wordline is in the standby state.

In an alternative embodiment, the present disclosure contemplates a memory device. The memory device comprises a plurality of memory cells arranged in an array of rows and columns to store data therein, wherein at least one of the rows in the array is held at a negative wordline voltage (VNWL) during a standby state thereof prior to a data access operation thereon. The memory device also comprises a plurality of isolation transistors wherein each isolation transistor is connected to a respective one of the columns in the array, wherein a gate terminal of at least one of the plurality of isolation transistors is held at the VNWL during the standby state of at least one of the rows. A system according to one embodiment of the present disclosure contemplates such memory device connected to a processor via a bus. The memory device stores therein data received from the processor over the bus and sends data stored therein to the processor via the bus, The present disclosure thus describes a system and method to reduce standby leakage current in the event of row-to-column shorts in a memory chip or in an electronic device having memory or data storage elements. In case of memory rows or wordlines precharged to a negative wordline voltage (VNWL), the standby leakage current through Psense-amplifiers in the memory is substantially eliminated when the gates of isolation (ISO) transistors associated with the shorted wordline and digitline(s) are held at the VNWL level by an isolation signal driven to the VNWL level during the memory row standby state. The reduction in the standby leakage current further reduces the overall Icc current consumption from the memory circuit's supply or operating voltage Vcc, thereby reducing circuit's standby power consumption. Because the ISO gates are already fabricated with thick oxides, the present negative voltage driving methodology does not require modifying the sense amplifier layout or the configuration of existing isolation transistors in a memory chip. A different standby voltage level (Vcc/2 voltage) at the sense amplifier activation (ACT) signal may also be implemented.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1"). Similarly, the terms "Vcc" and "Vccp" are used to refer to positive operating voltages in a circuit as is known in the art, and the term "GND" is used to refer to a common circuit ground potential (which may or may not be zero) as is known in the art. The Vcc, Vccp, and GND potentials may be considered as substantially fixed voltage levels in an electronic circuit.

Figure 4:
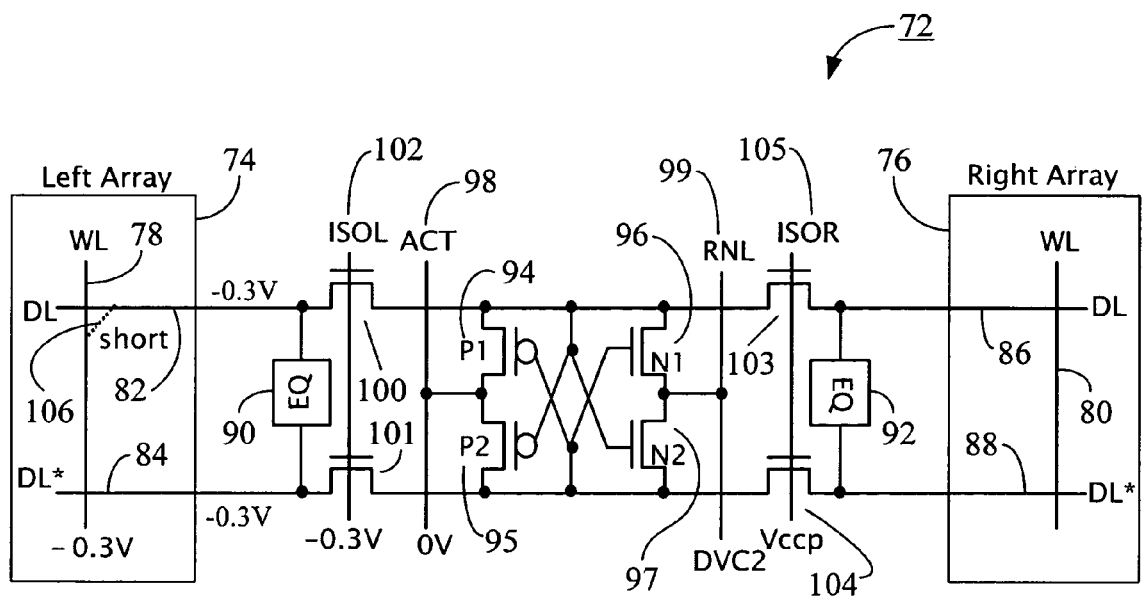
FIG. 4 shows an exemplary circuit configuration according to one embodiment of the present disclosure illustrating a row-to-column short and voltage levels at various memory control signals during a memory standby state.

FIG. 4 shows an exemplary circuit configuration 72 according to one embodiment of the present disclosure illustrating a row-to-column short 106 and voltage levels at various memory control signals during a memory standby state. Similar to the circuit in FIG. 2, the circuit 72 in FIG. 4 may be part of a memory chip's (e.g., the memory chip 124 in FIG. 9) internal architecture. The circuit 72 is shown to include a left memory array 74; a right memory array 76; two exemplary wordlines 78, 80; four exemplary digitlines 82, 84, 86, 88; two equalization (EQ) circuits 90, 92; a sense amplifier configuration including the Psense-amplifiers or transistors 94-95 and Nsense-amplifiers 96-97; two sense amplifier control lines—the ACT signal 98 and the RNL signal 99; two isolation transistors 100-101 associated with the digitlines 82, 84 in the left memory array 74 and the corresponding isolation signal ISOL 102; and two isolation transistors 103-104 associated with the digitlines 86, 88 in the right memory array 76 and the corresponding isolation signal ISOR 105. An exemplary short 106 between the WL 78 and the DL 82 in the left memory array 74 is also shown by a dashed line and discussed later hereinbelow. It is noted that although various circuit elements and signal lines in FIG. 4 are labeled with reference numerals different from the reference numerals used in FIG. 2 for circuit elements or signal lines having similar functionality, it is observed that the overall architecture in FIG. 4 is substantially similar to that shown for the memory portion in FIG. 2, except for the different signal level of the ISOL signal 102 in FIG. 4 as discussed below. Therefore, additional details of various circuit elements and signal lines in FIG. 4 is not provided for the sake of brevity.

Figure 2:
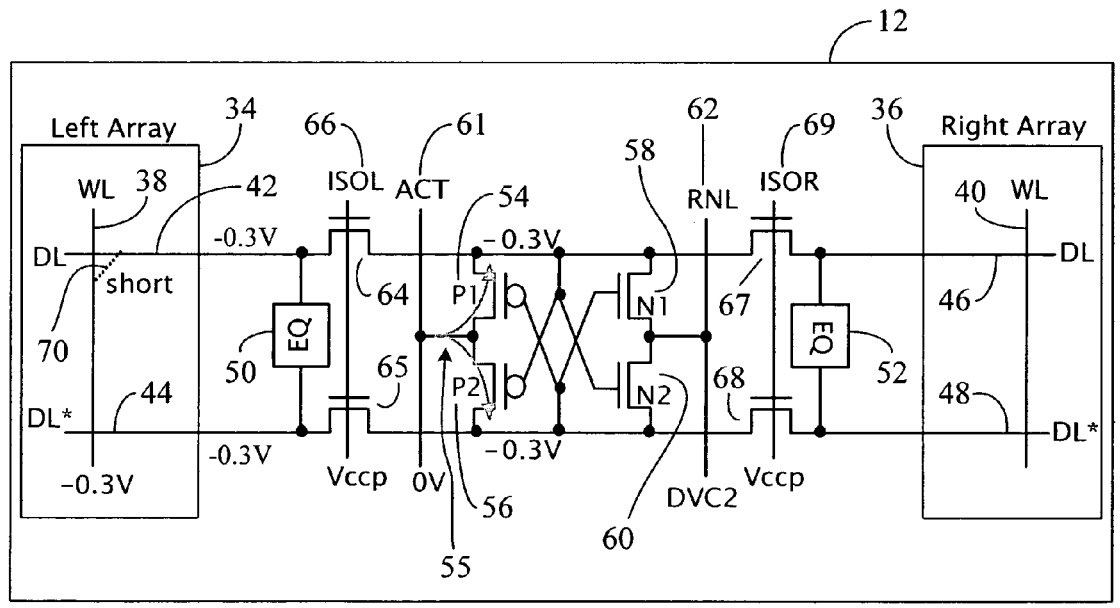
FIG. 2 is a simplified architecture for a portion of the memory device shown in FIG. 1.
Figure 3:
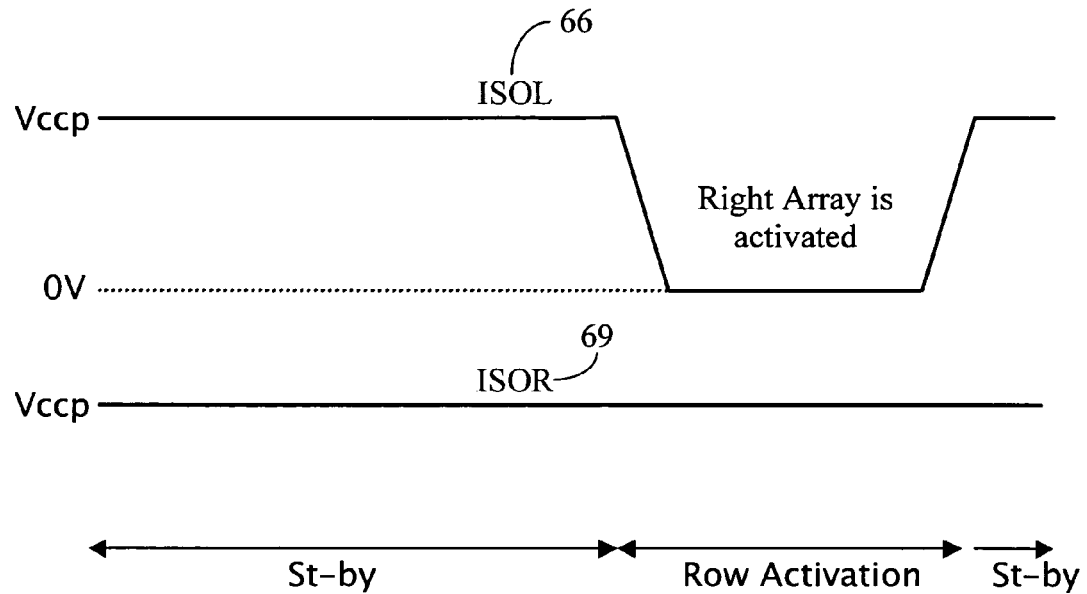
FIG. 3 illustrates the voltage levels of the ISOL and ISOR signals in FIG. 2 during row activation and row standby states.

As discussed before, a row-to-column short significantly increases the memory standby current in the VNWL-based prior art memory architecture shown in FIG. 2. To substantially prevent this standby current due to a row-to-column short (e.g., the short 106 in FIG. 4) in case of a negatively-held wordline (here, the wordline 78), the circuit configuration 72 in the embodiment of FIG. 4 employs a mechanism (discussed later with reference to FIG. 7) whereby the ISOL signal 102 is maintained at the same voltage level as the negative voltage level VNWL (−0.3V in one embodiment) on the precharged wordline 78 so long as the wordline 78 in the memory chip (not shown) is in the standby state (i.e., not yet fired to commence a data access operation for the data stored at wordline-digitline pairs 78-82, 78-84, etc.). It is noted here that, in general, the VNWL voltage may be equal to or less than the "low" voltage for the wordline (e.g., the voltage on the wordline during its standby state). Thus, in the embodiment of FIG. 4, the gates of the ISO transistors 100-101 are in the "off" state during the memory standby state because of the negative voltage on the ISOL line 102. Therefore, even if the row-to-column short 106 may result in the negative (−0.3V) voltages on the digitlines 82, 84 (possibly through the conduction through the transistors in the EQ circuit 90), the leakage current through the conduction of Psense-amplifiers P1 (94) and P2 (95) is substantially completely stopped because of the negative voltage on the ISOL line 102. The negative voltage of −0.3V as the "low" logic state of the ISOL signal 102 during a memory row standby period maintains the transistors P1-P2 in the cut-off state, thereby preventing the DC current leakage path from the Psense-amplifiers 94-95 to the VNWL line (not shown) held at −0.3V. The ISOL signal 102 may go to the "high" logic state (at Vccp voltage level) preferably only during a row activation period as discussed later hereinbelow with reference to FIG. 5.

It is observed with reference to the embodiment in FIG. 4 that the ISOR signal 105 may or may not be held at the VNWL level during the row standby state in the event that there is no WL-DL short in the right array 76. Thus, as shown in the embodiment of FIG. 4, the ISOR signal 105 may be held at the "high" or Vccp level during the row standby state. In the event that there are only Nsense-amplifiers 96-97 (i.e., no Psense-amplifiers 94-95) in the sense amplifier unit, any WL-DL short in the right array 76 may not trigger the standby leakage current in a memory cell because the negative voltage (e.g., −0.3V) on the lines DL 86 and DL* 88 would maintain the amplifiers N1 (96) and N2 (97) in a cut-off state. In general, however, when both P- and N-sense amplifiers are employed and an ISO signal (e.g., an ISOL signal 102 or an ISOR signal 105) is in the "high" state, the digitlines in the memory array "associated" with the ISO signal (e.g., the left memory array 74 for the ISOL signal 102 or the right memory array 76 for the ISOR signal 105) may be connected to both of the P- and N-sense amplifiers. In that event, if there is a WL-DL short, the short can trigger the memory cell leakage current via Psense-amplifiers as discussed earlier hereinbefore.

Thus, the ISO signal-based standby leakage current control method according to one embodiment of the present disclosure can cut off the current leakage path from Psense-amplifiers to the NEGWL by turning off the ISO gates (e.g., the gates of transistors 100-101) during the row standby period. Because of this methodology, there may be no negative voltage in the Psense-amplifiers 94-95 and, hence, there may be no need to modify the sense amplifier layout configuration in a memory chip (e.g., the memory chip 124 in FIG. 9). Thus, it may not be necessary to change the thin oxides at the gates of transistors P1 (94) and P2 (95) to thick oxides. Similarly, because the ISO gates (e.g., the gates of ISO transistors 100-101) already contain thick oxides, the driving of the ISOL signal to VNWL during the memory standby state may not require any further modification of the ISO transistor layouts in the memory chip.

Figure 5:
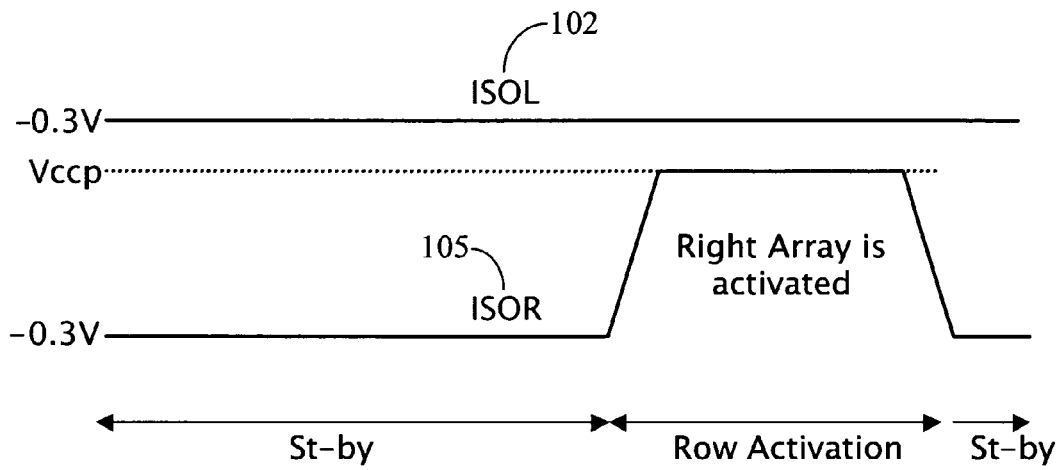
FIG. 5 depicts the voltage levels of the ISOL and ISOR signals in one embodiment of the circuit configuration in FIG. 4 during row activation and row standby states.

FIG. 5 depicts the voltage levels of the ISOL 102 and ISOR 105 signals in one embodiment of the circuit configuration 72 in FIG. 4 during row activation and row standby states. In the embodiment of FIG. 5, both the ISOL 102 and ISOR 105 lines in FIG. 4 are held at the VNWL level (−0.3V) so long as a memory row is in a standby state. However, when a row (e.g., the row 80 in FIG. 4) in the right memory array 76 is activated or fired, the ISOR signal 105 may be asserted "high" (Vccp level) to connect the associated memory storage elements (e.g., the memory elements (not shown) at the junctions of row 80 and columns 86 and 88) to the sense amplifier unit (consisting of transistors P1, P2, N1, and N2) to facilitate the data sensing operation. During this right row activation state, the ISOL signal 102 may remain at the VNWL level to maintain isolation between the left memory array and the P-N sense amplifiers (more specifically, between the left memory array and the digitlines (not shown) in the sense amplifier unit as discussed hereinbefore with reference to FIG. 2).

Figure 6:
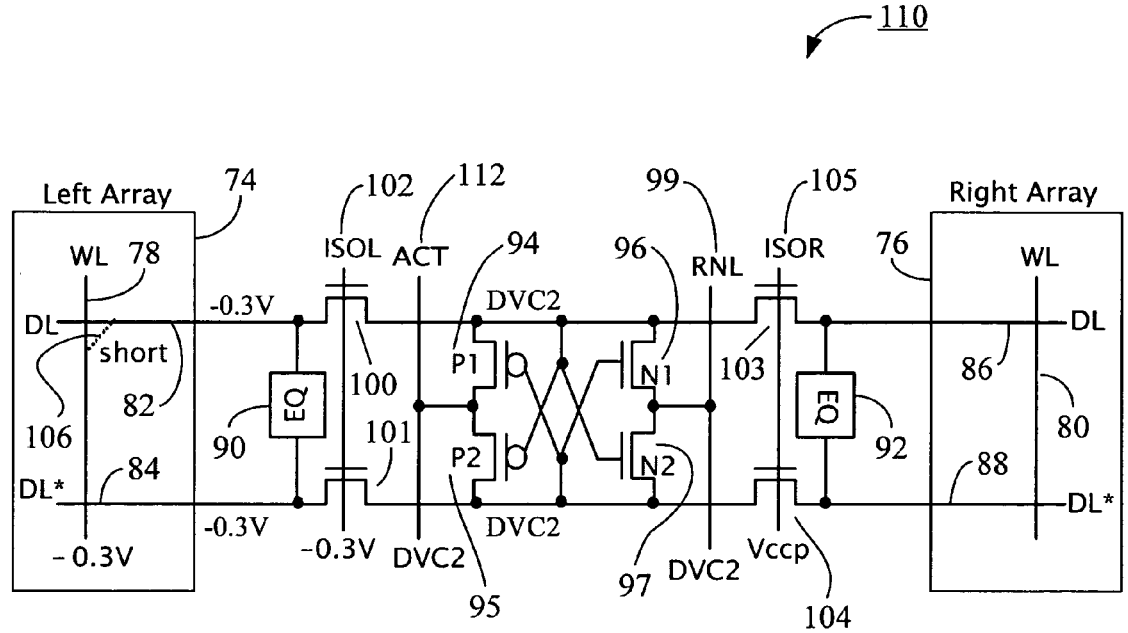
FIG. 6 illustrates an exemplary circuit configuration according to another embodiment of the present disclosure showing a different combination of voltage levels at various memory control signals during a memory standby state.

FIG. 6 illustrates an exemplary circuit configuration 110 according to another embodiment of the present disclosure showing a different combination of voltage levels at various memory control signals during a memory standby state.

Because of substantial similarity between the embodiments in FIGS. 4 and 6, the same reference numerals are used in FIGS. 4 and 6 to refer to identical circuit elements or signal lines. It is observed from a comparison of FIGS. 4 and 6 that the ACT line 112 in FIG. 6 is shown held at the DVC2 (i.e., Vcc/2) voltage level during the memory standby state rather than at the GND (0V) level as in FIG. 4. Because of the VNWL voltage level at the ISOL signal 102 and the resulting complete isolation between the left memory array 74 and the sense amplifier unit (including transistors P1, P2, N1, and N2), it may not be necessary to maintain the ACT signal 112 at the ground level (as is the case with the ACT signal 98 in the embodiment of FIG. 4) as the "low" logic level. Instead, the ACT signal 112 may be held at the DVC2 (or Vcc/2) level during the row standby state as shown in FIG. 6. In an alternative embodiment, the ACT signal 112 and the RNL signal 99 may be shorted at the time of equalization to equalize both of these signals to the DVC2 level with less power consumption.

Figure 7:
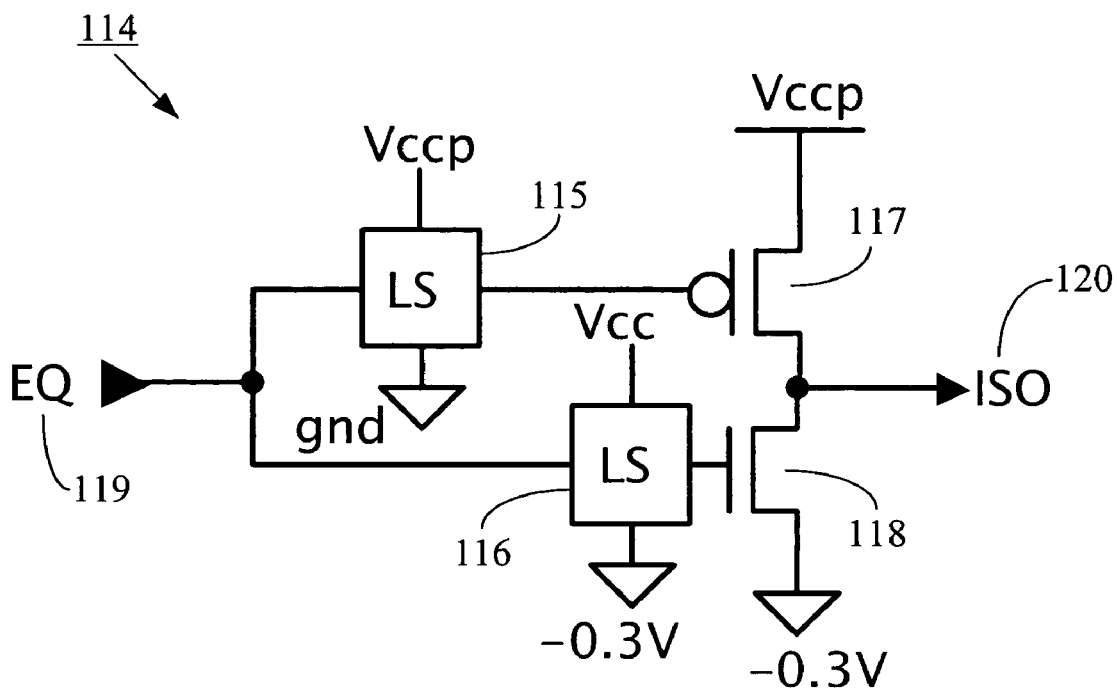
FIG. 7 shows an exemplary circuit configuration according to one embodiment of the present disclosure illustrating how to generate an ISO signal in the memory architectures of FIGS. 4 and 6.

FIG. 7 shows an exemplary circuit configuration 114 according to one embodiment of the present disclosure illustrating how to generate an ISO signal 120 in the memory architectures of FIGS. 4 and 6. The circuit configuration 114 of FIG. 7 may be used to generate one or both of the ISOL signal 102 and the ISOR signal 105 depending on the desired circuit configuration. The ISO signal generation circuit 114 may include two level shifter (LS) circuits 115 and 116, one PMOS transistor 117, and one NMOS transistor 118 connected as shown in FIG. 7. A level shifter circuit may output one of the two voltage levels at which the circuit operates. For example, the LS circuit 115 may output either the Vccp or the GND voltage level, whereas the LS circuit 116 may output either the Vcc or the VNWL (here, −0.3V) voltage level in response to the state of the input equalization (EQ) signal 119 as discussed in more detail hereinbelow with reference to FIG. 8. It is noted that the EQ signal 119 may be the same equalization signal that is supplied to the EQ circuits (e.g., the circuits 90 and 92 in FIGS. 4 and 6) during row precharge, standby, and activation states. The ISO signal 120 may assume the Vccp level when the PMOS transistor 117 is turned on by the output of the LS circuit 115. On the other hand, the ISO signal 120 may be held at the VNWL level (−0.3V) when the NMOS transistor 118 is turned on by the output of the LS circuit 116. Because the level shifter circuits are known in the art, additional constructional details for the circuits 115-116 are not provided herein for the sake of brevity.

Figure 8:
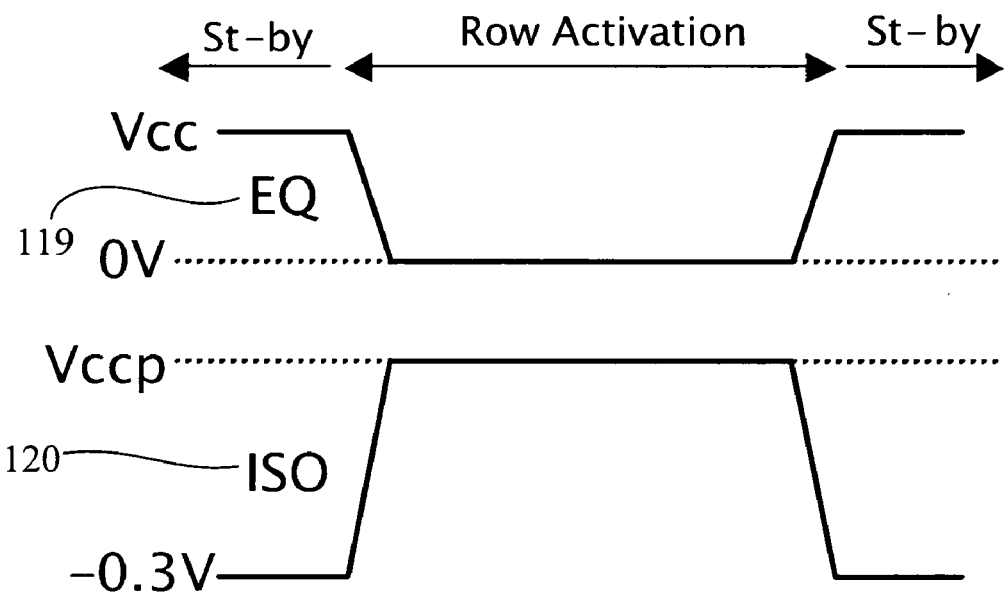
FIG. 8 is a set of waveforms depicting the signal relationship between the EQ and the ISO signals in the circuit configuration of FIG. 7.

FIG. 8 is a set of waveforms depicting the signal relationship between the EQ 119 and the ISO 120 signals in the circuit configuration 114 of FIG. 7. As is seen from FIG. 8, the EQ signal 119 is at the Vcc level during a row standby state, but is asserted "low" (0V) during a row activation state. When the EQ signal 119 is at Vcc level, the LS circuit 115 may output the Vccp voltage level to the gate of the transistor 117, thereby maintaining the transistor 117 in a cut-off state. However, the "high" level on the EQ signal 119 may result in the LS circuit 116 outputting the Vcc voltage level to the NMOS transistor 118, thereby turning the transistor on to achieve the VNWL (−0.3V) voltage level for the ISO signal 120 as seen in FIG. 8. The reverse occurs when the EQ signal 119 goes to a "low" state (0V) during the row activation period. Here, the LS circuit 115 may output a "low" voltage (GND) to the PMOS 117, thereby turning it on, whereas the LS circuit 116 may supply the −0.3V at the gate of the NMOS 118 to turn the NMOS off, thereby resulting in a "high" voltage level (Vccp) at the ISO output 120 in the circuit 114. It is seen from FIG. 5 that the voltage levels of the ISO signal 120 in FIG. 8 qualify it to function as the ISOR signal 105 depicted in the embodiment of FIG. 5. A circuit configuration similar to that shown in FIG. 7 may be devised to achieve the desired signal levels for the ISOL signal 102 in FIGS. 4 and 6 as mentioned before.

Figure 1:
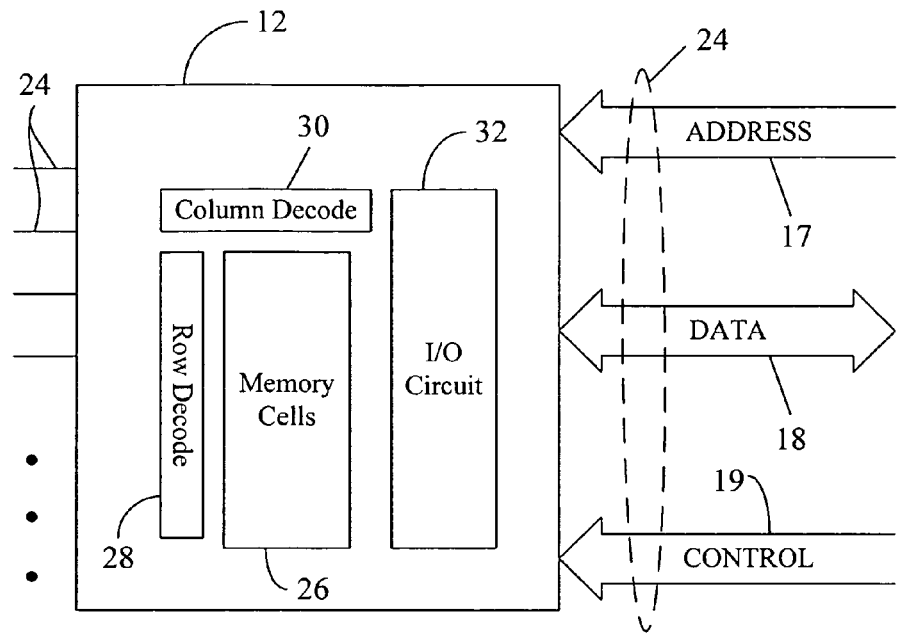
FIG. 1 is a simplified block diagram showing a memory chip or memory device.
Figure 9:
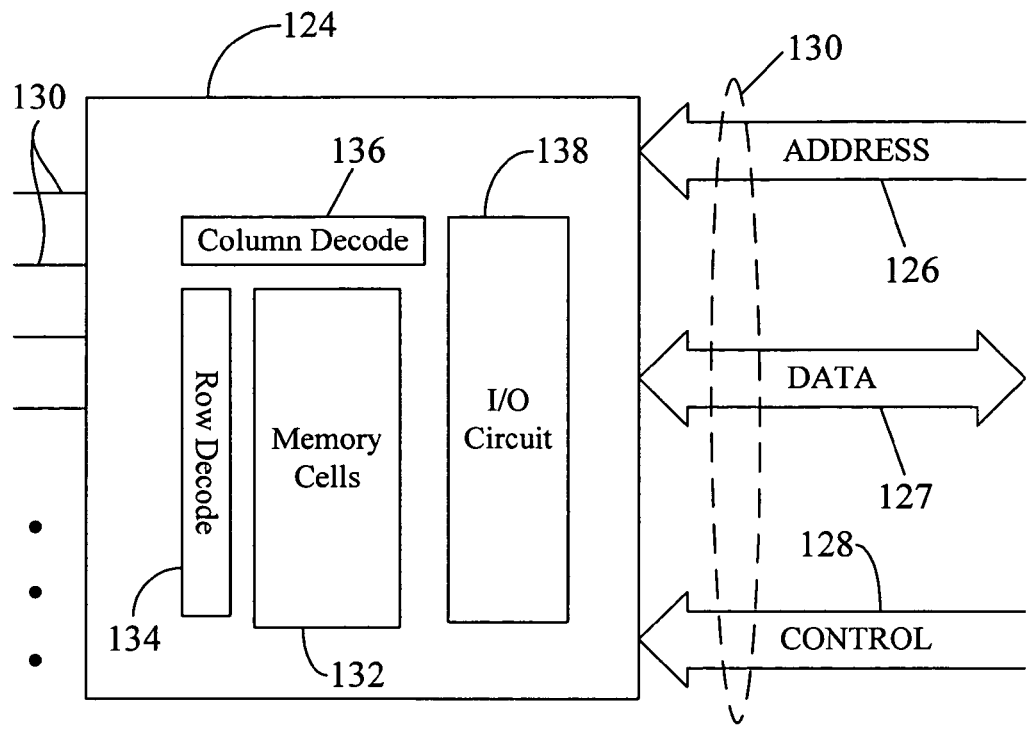
FIG. 9 is a simplified block diagram showing a memory chip that employs the circuit configurations of FIG. 4 or 6.

FIG. 9 is a simplified block diagram showing a memory chip 124 that employs the circuit configurations of FIGS. 4 or 6. The memory chip 124 includes an address bus 126, a data bus 127, and a control bus 128, which are all part of the pins 130. For the sake of simplicity, all the pins on the memory chip 124 are designated by the same reference numeral "130." Similar to the memory chip 12 of FIG. 1, the memory chip 124 in FIG. 9 also includes a memory cell array 132 where memory cells are organized into rows and columns (which may be divided into a right array and left array as shown in FIGS. 4 and 6), a row decode unit 134, a column decode unit 136, and an I/O unit 138, and additional circuits (not shown). Because of the substantial similarity between the architectures and functionality of the memory chip 12 (FIG. 1) and the memory chip 124 (FIG. 9), additional discussion of the constituent blocks in the memory chip 124 is not provided herein. It is noted, however, that the memory chip 124 includes either the circuit configuration 72 of FIG. 4 or the circuit configuration 110 of FIG. 6 depending on the desired standby signal level for the ACT signal. The chosen circuit configuration may be implemented through various memory blocks in the chip 124. For example, if the circuit configuration 72 in FIG. 4 is employed as part of the memory architecture of the chip 124, then a portion (e.g., the left array 74 and the right array 76) of the circuit configuration 72 may represent the memory cells 132; the sense amplifiers 94-97, the equalization circuits 90, 92, and other control signal generation circuits (e.g., the ISO signal generation circuit 114 of FIG. 7) may be part of the I/O unit 138, etc. The exact location or placement of various architectural units or blocks illustrated in FIGS. 4 and 6 within the memory chip 124 is not relevant.

The memory chip 124 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 80 is a DDR DRAM operating at a clock frequency of 333 MHz and an I/O data rate of 667 MHz. It is noted here that although various architectural elements in the memory chip 124 and the chip 12 in FIG. 1 overlap or are functionally similar, it may be possible that those components having same or similar functionality may not be identical in the memories 12 and 124 because of the presence of a different control signal voltage level scheme (using a different standby state signal levels for the ISO and ACT signals as shown, for example, in FIG. 6) in the embodiment of FIG. 9.

Figure 10:
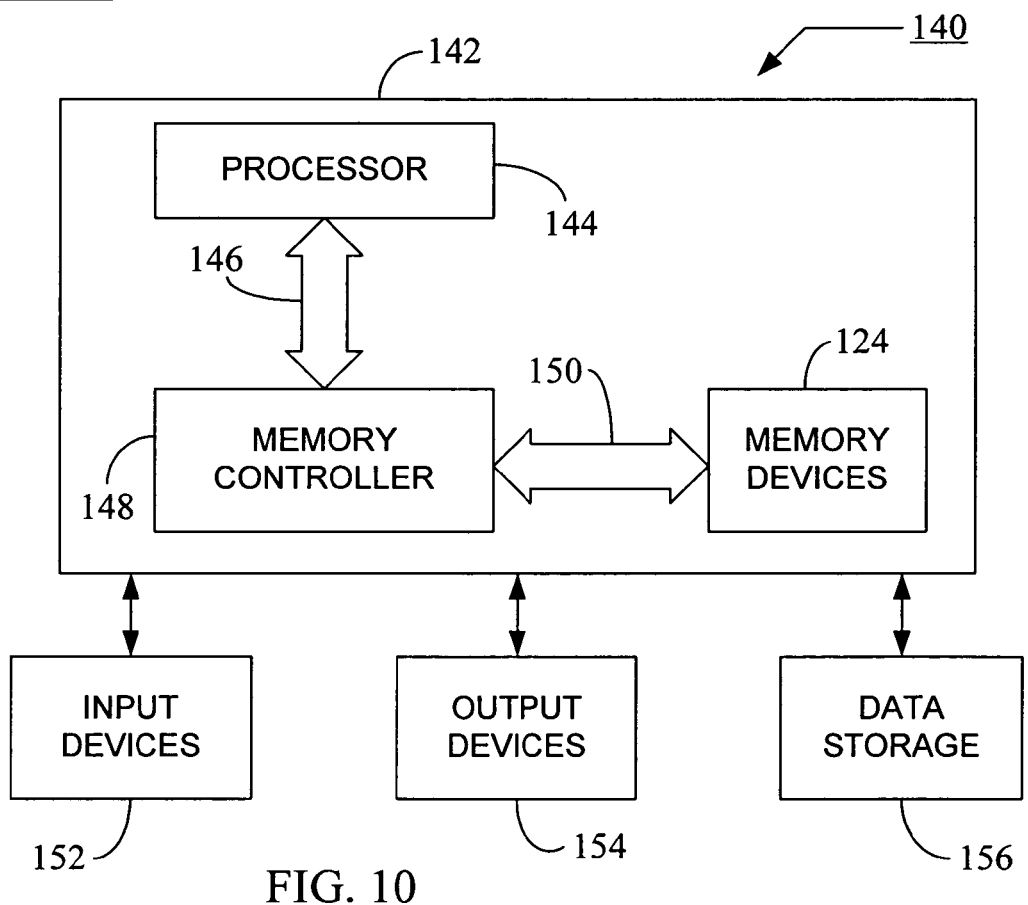
FIG. 10 is a block diagram depicting a system in which one or more memory chips illustrated in FIG. 9 may be used.

FIG. 10 is a block diagram depicting a system 140 in which one or more memory chips 124 illustrated in FIG. 9 may be used. The system 140 may include a data processing unit or computing unit 142 that includes a processor 144 for performing various computing functions, such as executing specific software to perform specific calculations or data processing tasks. The computing unit 142 also includes a memory controller 148 that is in communication with the processor 144 through a bus 146. The bus 146 may include an address bus (not shown), a data bus (not shown), and a control bus (not shown). The memory controller 148 is also in communication with a set of memory devices 124 (i.e., multiple memory chips 124 of the type shown in FIG. 9) through another bus 150 (which may be similar to the bus 130 shown in FIG. 9). Each memory device 124 may include appropriate data storage and retrieval circuitry (not shown in FIG. 10) as shown in FIG. 9. The processor 144 can perform a plurality of functions based on information and data stored in the memories 124.

The memory controller 148 can be a microprocessor, digital signal processor, embedded processor, micro-controller, dedicated memory test chip, a tester platform, or the like. The memory controller 148 may control routine data transfer operations to/from the memories 124, for example, when the memory devices 80 are part of an operational computing system 142. The memory controller 148 may reside on the same motherboard (not shown) as that carrying the memory chips 124. Various other configurations of electrical connection between the memory chips 124 and the memory controller 148 may be possible. For example, the memory controller 148 may be a remote entity communicating with the memory chips 124 via a data transfer or communications network (e.g., a LAN (local area network) of computing devices).

The system 140 may include one or more input devices 152 (e.g., a keyboard or a mouse) connected to the computing unit 142 to allow a user to manually input data, instructions, etc., to operate the computing unit 142. One or more output devices 154 connected to the computing unit 142 may also be provided as part of the system 140 to display or otherwise output data generated by the processor 144. Examples of output devices 154 include printers, video terminals or video display units (VDUs). In one embodiment, the system 140 also includes one or more data storage devices 156 connected to the data processing unit 142 to allow the processor 144 to store data in or retrieve data from internal or external storage media (not shown). Examples of typical data storage devices 156 include drives that accept hard and floppy disks, CD-ROMs (compact disk read-only memories), and tape cassettes. As noted before, the memory devices 124 in the computing unit 142 have the configuration illustrated in FIG. 9, i.e., each memory device 124 may include one of the circuit configurations illustrated in FIGS. 4 and 6 as discussed before.

It is observed that although the discussion given hereinbefore has focused on row-to-column shorts in memory devices, the maintenance of negative voltage (VNWL) on an ISO line in a memory device may be made a permanent, design feature for all ISO lines in the memory device regardless of whether a row-to-column short is present. When such configuration is fabricated as part of the memory chip, the negatively-driven ISO lines may protect against excessive standby currents arising from future row-to-column shorts or similar defects in the memory chip arising after fabrication or from field use. Further, although the discussion given hereinabove has been primarily with reference to memory devices, it is evident that the standby current reduction methodology discussed hereinbefore with reference to FIGS. 4-8 may be employed, with suitable modifications which may be evident to one skilled in the art, in any other electronic device that may have data storage elements and utilize a memory array-type architecture discussed with reference to the memory chip embodiments in FIGS. 4 and 6. The reduction in standby current in such data storage elements in such an electronic device may be obtained using the negative voltage driving for the ISO gates discussed hereinabove or a methodology similar in principle as may be evident to one skilled in the art. It is further noted that in case of memory devices or data storage elements having memory cells not partitioned into left and right memory arrays (as is the case in the embodiments of FIGS. 4 and 6) and having only one isolation (ISO) signal, the teachings according to the present disclosure may be suitably implemented by one skilled in the art, if needed, to drive the ISO signal to negative voltage level during a row standby state to prevent the standby leakage current through Psense-amplifiers.

The foregoing describes a system and method to reduce standby leakage current in the event of row-to-column shorts in a memory chip or in an electronic device having memory or data storage elements. In case of memory rows or wordlines precharged to a negative wordline voltage (VNWL), the standby leakage current through Psense-amplifiers in the memory is substantially eliminated when the gates of isolation (ISO) transistors associated with the shorted wordline and digitline(s) are held at the VNWL level by an isolation signal driven to the VNWL level during the memory row standby state. The reduction in the standby leakage current further reduces the overall Icc current consumption from the memory circuit's supply or operating voltage Vcc, thereby reducing circuit's standby power consumption. Because the ISO gates are already fabricated with thick oxides, the present negative voltage driving methodology does not require modifying the sense amplifier layout or the configuration of existing isolation transistors in a memory chip. A different standby voltage level (Vcc/2 level instead of 0V) at the sense amplifier activation (ACT) signal is also discussed.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a memory device, comprising:
   precharging a wordline in said memory device to a predetermined voltage level prior to a data access operation thereon; and
   maintaining a gate of an isolation transistor in said memory device at said predetermined voltage level prior to said data access operation, said isolation transistor positioned in a digitline to isolate a memory array from a sense amplifier.

2. The method of claim 1, wherein said maintaining includes:
   using an equalization signal to generate an isolation signal having said predetermined voltage; and
   applying said isolation signal to said gate of said isolation transistor.

3. The method of claim 2, wherein said using includes:
   triggering a voltage level shifter circuit with said equalization signal so as to generate said predetermined voltage for said isolation signal.

4. A method of operating a memory device, comprising:
   precharging a wordline in said memory device to a predetermined voltage level prior to a data access operation thereon;
   maintaining a gate of an isolation transistor in said memory device at said predetermined voltage level prior to said data access operation, said isolation transistor positioned in a digitline to isolate a memory array from a sense amplifier; and
   establishing an identical predetermined voltage level for a first control signal for Psense-amplifiers in said memory device and for a second control signal for Nsense-amplifiers in said memory device prior to said data access operation.

5. A method of operating a memory device, comprising:
   precharging a wordline in said memory device to a predetermined voltage level prior to a data access operation thereon;
   maintaining a gate of an isolation transistor in said memory device at said predetermined voltage level prior to said data access operation, said isolation transistor positioned in a digitline to isolate a memory array from a sense amplifier; and
   equalizing a first control signal for Psense-amplifiers in said memory device and a second control signal for Nsense-amplifiers in said memory device to an identical voltage level prior to said data access operation.

6. A method of operating a memory device, comprising:
   precharging a wordline in said memory device to a predetermined voltage level prior to a data access operation thereon;
   maintaining an isolation signal line in said memory device at said predetermined voltage level prior to said data access operation; and
   delivering said isolation signal to a gate of an isolation transistor positioned in a digitline to isolate a memory array from a sense amplifier.

7. The method of claim 6, wherein said maintaining includes:
   using an equalization signal to establish said predetermined voltage on said isolation signal line.

8. The method of claim 7, wherein said using includes:
   triggering a voltage level shifter circuit with said equalization signal so as to generate said predetermined voltage for said isolation signal line.

9. A method of operating a memory device, comprising:
   precharging a wordline in said memory device to a predetermined voltage level prior to a data access operation thereon;
   maintaining an isolation signal line in said memory device at said predetermined voltage level prior to said data access operation;
   delivering a signal on said isolation signal line to an isolation transistor positioned in a digitline to isolate a memory array from a sense amplifier; and
   equalizing a first control signal for Psense-amplifiers in said memory device and a second control signal for Nsense-amplifiers in said memory device to an identical voltage level prior to said data access operation.

10. A method of operating a memory device, comprising:
    precharging a wordline in said memory device to a predetermined voltage level prior to a data access operation thereon;
    maintaining an isolation signal line in said memory device at said predetermined voltage level prior to said data access operation;
    delivering a signal on said isolation signal line to an isolation transistor positioned in a digitline to isolate a memory array from a sense amplifier; and
    driving an activation signal for Psense-amplifiers in said memory device to either a ground level or to a Vcc/2 voltage level prior to said data access operation.

11. The method of claim 6, further comprising:
    driving an activation signal for Psense-amplifiers in said memory device to either a ground level or a Vcc/2 voltage level prior to said data access operation.

12. A method of operating a memory device, comprising:
    placing the memory device in a standby state prior to a data access operation thereon;
    maintaining a negative voltage in said memory device so long as said memory device is in said standby state; and
    delivering said negative voltage to a gate of an isolation transistor positioned in a digitline to isolate a memory array from a sense amplifier.

13. A method of operating a memory device of the type having a plurality of wordlines and a plurality of digitlines, each of said digitlines having an isolation transistor, said method comprising:
    placing said plurality of wordlines in said memory device in a standby state prior to a data access operation; and
    maintaining a negative voltage on the gates of said isolation transistors so long as said wordlines are in said standby state, each of said isolation transistors positioned in a digitline to isolate a memory array from a sense amplifier.

14. A method of operating a memory device, comprising:
    placing a wordline in said memory device at a negative voltage level during a standby state of said wordline prior to a data access operation; and
    maintaining said negative voltage level on a gate of an isolation transistor in said memory device so long as said wordline is in said standby state, said isolation transistor positioned in a digitline to isolate a memory array from a sense amplifier.

15. A method of operating a memory device, comprising:
    placing a wordline in said memory device at a negative voltage level during a standby state of said wordline prior to a data access operation;
    maintaining said negative voltage level on a gate of an isolation transistor in said memory device so long as said wordline is in said standby state, said isolation transistor positioned in a digitline to isolate a memory array from a sense amplifier; and
    driving an activation signal for Psense-amplifiers in said memory device to one of a ground level or a Vcc/2 voltage level prior to said data access operation.

16. The method of claim 14, further comprising:
    driving an activation signal for Psense-amplifiers in said memory device to one of a ground level or a Vcc/2 voltage level prior to said data access operation.

17. The method of claim 14, wherein said maintaining includes:
    using an equalization signal to generate an isolation signal having said negative voltage level; and
    applying said isolation signal to said gate of said isolation transistor.

18. The method of claim 17, wherein said using includes:
    triggering a voltage level shifter circuit with said equalization signal so as to generate said negative voltage level for said isolation signal.

19. A method of operating an electronic device containing a memory to store data therein,
    said method comprising:
    placing a wordline in said memory at a negative voltage level during a standby state prior to a data access operation thereon;
    maintaining said negative voltage level on an isolation signal in said memory so long as said wordline is in said standby state; and
    delivering said isolation signal to a gate of an isolation transistor positioned in a digitline to isolate a memory array from a sense amplifier.

20. In a method of operating a solid state memory device of the type requiring an isolation signal delivered to a gate of an isolation transistor positioned in a digitline to isolate a memory array from a sense amplifier, said isolation signal having a first voltage level when a wordline in said memory device is in a standby state and having a second voltage level when said wordline is in an active state, the improvement comprising maintaining said first voltage level at or below a negative voltage level on said wordline during said standby state.

21. In the method of claim 20, the improvement further comprising maintaining said second voltage level at a Vccp voltage level when said wordline is in said active state.

22. In a method of operating a solid state memory device of the type requiring an isolation signal delivered to a gate of an isolation transistor positioned in a digitline to isolate a memory array from a sense amplifier, said isolation signal having a first voltage level when a wordline in said memory device is in a standby state and having a second voltage level when said wordline is in an active state, the improvement comprising maintaining said first voltage level at or below a negative voltage level on said wordline during said standby state, the improvement further comprising equalizing a first control signal for Psense-amplifiers in said memory device and a second control signal for Nsense-amplifiers.

23. A memory device, comprising:
a plurality of memory cells arranged in an array of rows and columns to store data therein, wherein at least one of said rows in said array is held at a negative wordline voltage (VNWL) during a standby state thereof prior to a data access operation thereon; and
a plurality of isolation transistors wherein each isolation transistor is positioned in a respective one of said columns to isolate said array from a plurality of sense amplifiers, wherein a gate terminal of at least one of said plurality of isolation transistors is held at said VNWL during said standby state of said at least one of said rows.

24. The memory device of claim 23, wherein said VNWL is at least −0.3V.

25. The memory device of claim 23, wherein said gate terminal of said at least one of said plurality of isolation transistors is held at a Vccp voltage level when said at least one of said rows in said array is activated for said data access operation, wherein said Vccp voltage level is higher than an operating voltage of Vcc for said memory device.

26. A memory device, comprising:
a plurality of memory cells arranged in an array of rows and columns to store data therein, wherein at least one of said rows in said array is held at a negative wordline voltage (VNWL) during a standby state thereof prior to a data access operation thereon; and
a plurality of isolation transistors wherein each isolation transistor is connected to a respective one of said columns in said array, wherein a gate terminal of at least one of said plurality of isolation transistors is held at said VNWL during said standby state of said at least one of said rows; and
a plurality of sense amplifiers wherein each sense amplifier is connected to a respective pair of said columns in said array through two of said plurality of isolation transistors to isolate said array from said sense amplifiers, and wherein each sense amplifier includes a pair of Psense-amplifiers and a pair of Nsense-amplifiers, wherein a first control signal for said pair of Psense-amplifiers and a second control signal for said pair of Nsense-amplifiers in at least one of said plurality of sense amplifiers are held at an identical voltage level during said standby state of said at least one of said columns.

27. The memory device of claim 26, wherein said identical voltage level is a Vcc/2 voltage level, wherein Vcc is an operating voltage for said memory device.

28. The memory device of claim 23, further comprising:
an isolation signal generation circuit configured to receive an equalization signal as an input thereof and to generate an isolation signal at an output thereof, wherein said isolation signal is connected to said gate terminal of said at least one of said plurality of isolation transistors.

29. The memory device of claim 28, wherein said isolation signal generation circuit includes a voltage level shifter circuit configured to be triggered by said equalization signal so as to generate said VNWL as said isolation signal at said output of said isolation signal generation circuit during said standby state of said at least one of said rows.

30. A system, comprising:
a processor;
a bus; and
a memory device connected to said processor via said bus to store therein data received from said processor over said bus and to send data stored therein to said processor via said bus, wherein said memory device comprises:
a plurality of memory cells arranged in an array of rows and columns to store data therein, wherein at least one of said rows in said array is held at a negative wordline voltage (VNWL) during a standby state thereof prior to a data access operation thereon; and
a plurality of isolation transistors wherein each isolation transistor is positioned in a respective one of said columns to isolate said array from a plurality of sense amplifiers, wherein a gate terminal of at least one of said plurality of isolation transistors is held at said VNWL during said standby state of said at least one of said rows.

31. The system of claim 30, wherein said VNWL in said memory device is at least −0.3V.

32. A system, comprising:
a processor;
a bus; and
a memory device connected to said processor via said bus to store therein data received from said processor over said bus and to send data stored therein to said processor via said bus, wherein said memory device comprises:
a plurality of memory cells arranged in an array of rows and columns to store data therein, wherein at least one of said rows in said array is held at a negative wordline voltage (VNWL) during a standby state thereof prior to a data access operation thereon; and
a plurality of isolation transistors wherein each isolation transistor is positioned in a respective one of said columns in said array columns to isolate said array from a plurality of sense amplifiers, wherein a gate terminal of at least one of said plurality of isolation transistors is held at said VNWL during said standby state of said at least one of said rows;
wherein, in said memory device, said gate terminal of said at least one of said plurality of isolation transistors is held at a Vccp voltage level when said at least one of said rows in said array is activated for said data access operation, wherein said Vccp voltage level is higher than an operating voltage of Vcc for said memory device.

33. A system, comprising:
a processor;
a bus; and
a memory device connected to said processor via said bus to store therein data received from said processor over said bus and to send data stored therein to said processor via said bus, wherein said memory device comprises:

a plurality of memory cells arranged in an array of rows and columns to store data therein, wherein at least one of said rows in said array is held at a negative wordline voltage (VNWL) during a standby state thereof prior to a data access operation thereon;

a plurality of isolation transistors wherein each isolation transistor is connected to a respective one of said columns in said array, wherein a gate terminal of at least one of said plurality of isolation transistors is held at said VNWL during said standby state of said at least one of said rows; and a plurality of sense amplifiers wherein each sense amplifier is connected to a respective pair of said columns in said array through two of said plurality of isolation transistors to isolate said array from said sense amplifiers, and wherein each sense amplifier includes a pair of Psense-amplifiers and a pair of Nsense-amplifiers, wherein a first control signal for said pair of Psense-amplifiers and a second control signal for said pair of Nsense-amplifiers in at least one of said plurality of sense amplifiers are held at an identical voltage level during said standby state of said at least one of said rows.

34. The system of claim 33, wherein, in said memory device, said identical voltage level is a Vcc/2 voltage level, wherein Vcc is an operating voltage for said memory device.

35. The system of claim 30, wherein said memory device further comprises:

an isolation signal generation circuit configured to receive an equalization signal as an input thereof and to generate an isolation signal at an output thereof, wherein said isolation signal is connected to said gate terminal of said at least one of said plurality of isolation transistors.

36. The system of claim 35, wherein, in said memory device, said isolation signal generation circuit includes a voltage level shifter circuit configured to be triggered by said equalization signal so as to generate said VNWL as said isolation signal at said output of said isolation signal generation circuit during said standby state of said at least one of said rows.

37. A method of operating a memory device of the type having a plurality of wordlines and a plurality of digitlines, each of said digitlines having an isolation transistor, said method comprising:

precharging each of said wordlines to a predetermined negative voltage level prior to a data access operation; and maintaining the gates of said isolation transistors at or below said predetermined negative voltage level prior to said data access operation without the gates of said isolation transistors being directly connected to said wordlines, each of said isolation transistors positioned in a digitline to isolate a memory array from a sense amplifier.

* * * * *